United States Patent [19]

Lee

[11] Patent Number: 5,153,511
[45] Date of Patent: Oct. 6, 1992

[54] TEST LEAD SOCKET INDICATING DEVICE FOR A VOLT-OHM-MILLIAMETER

[76] Inventor: Chung-Cheng Lee, No. 16, Shing-Gone Rd., Yung-Kang Industrial Park, Yung Kang Hsiang, Tainan Hsien, Taiwan

[21] Appl. No.: 808,164

[22] Filed: Dec. 13, 1991

[51] Int. Cl.$^5$ .............................................. G01R 15/08
[52] U.S. Cl. .................... 324/115; 324/99 D; 324/114; 324/116; 324/157
[58] Field of Search ............ 324/115, 114, 116, 99 D, 324/122, 120, 123 R, 157, 127; 340/686, 687, 540

[56] References Cited

U.S. PATENT DOCUMENTS

| | | | |
|---|---|---|---|
| 4,525,706 | 6/1985 | Nishikawa et al. | 340/540 |
| 4,604,569 | 8/1986 | Tedd et al. | 324/115 |
| 4,727,310 | 2/1988 | Hashimoto et al. | 324/99 D |
| 4,748,404 | 5/1988 | Heinze et al. | 324/114 |

Primary Examiner—Vinh Nguyen
Attorney, Agent, or Firm—Kane, Dalsimer, Sullivan, Kurucz, Levy, Eisele & Richard

[57] ABSTRACT

A test lead socket indicating device is used for a volt-ohm-milliammeter (VOM) having a select input which is operable to set the VOM in a voltage, current or resistance measuring mode, a common input socket, a voltage socket, a resistance socket and a current socket. The test lead socket indicating device includes an indicator unit provided on the VOM and having a voltage indicator lamp disposed adjacent to the voltage socket, a current indicator lamp disposed adjacent to the current socket and a resistance indicator lamp disposed adjacent to the resistance socket. A counter unit has an input terminal connected to the select input. The counter unit has a digital signal output which is incremented each time the select input is operated. A decoder unit receives the digital signal output from the counter unit. The decoder unit activates one of the voltage, current and resistance indicator lamps according to the digital signal output. The voltage, current and resistance indicator lamps indicate to which one among the voltage, current and resistance sockets a test lead should be connected.

2 Claims, 5 Drawing Sheets

TEST LEAD SOCKET INDICATING DEVICE FOR A VOLT-OHM-MILLIAMETER

BACKGROUND OF THE INVENTION

1. Field of the Invention

The invention relates to an indicating device, more particularly to a test lead socket indicating device for a volt-ohm-milliameter.

2. Description of the Related Art

Referring to FIG. 1, a conventional volt-ohm-milliameter (VOM) is shown to have rotary input (11) [a push button input may also be used] and a pair of test leads (12, 13) for connecting the VOM to a circuit undergoing testing. The VOM may be operated in a voltage, current or resistance measuring mode. The VOM is provided with a common input socket (14), a voltage socket (15), a resistance socket (17) and a current socket (16). The test lead (12) has one end connected to the common input socket (14). The test lead (13) has one end connected to one of the remaining sockets (15, 16, 17), depending upon the desired measuring mode of the VOM.

A main drawback of the conventional VOM is that connection of the test lead (13) to an incorrect one of the sockets (15, 16, 17) easily occurs. For example, the output terminals of a test circuit are short-circuited if the test lead (13) is accidentally connected to the current socket (16) when the VOM is used to measure the output voltage of the test circuit. The short-circuit current which is produced can cause damage to the test circuit and to the VOM.

SUMMARY OF THE INVENTION

Therefore, the main objective of the present invention is to provide a test lead socket indicating device for a volt-ohm-milliameter which can indicate to which socket among the voltage, current and resistance sockets of the volt-ohm-milliameter a test lead should be connected.

Accordingly, the preferred embodiment of a test lead socket indicating device of the present invention is to be used in combination with a volt-ohm-milliameter having a common input socket, a voltage socket, a resistance socket, a current socket, and a select input means that is operable to set the volt-ohm-milliameter in a voltage, current or resistance measuring mode. The test lead socket indicating device comprises:

an indicator unit provided on the volt-ohm-milliameter and which includes a voltage indicator lamp disposed adjacent to the voltage socket, a current indicator lamp disposed adjacent to the current socket and a resistance indicator lamp disposed adjacent to the resistance socket;

a counter unit having an input terminal connected to the select input means, said counter unit having a digital signal output which is incremented each time the select input means is operated;

a decoder unit for receiving the digital signal output from the counter unit, said decoder unit activating one among the voltage, current and resistance indicator lamps according to the digital signal output; said voltage, current and resistance indicator lamps indicating to which one among the voltage, current and resistance sockets a test lead should be connected; and a timer unit reset by the counter unit each time the digital signal output of the counter unit changes, said timer unit cutting off power supply to the volt-ohm-milliameter after a predetermined period of time in which no change in the digital signal output of the counter unit has occurred.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
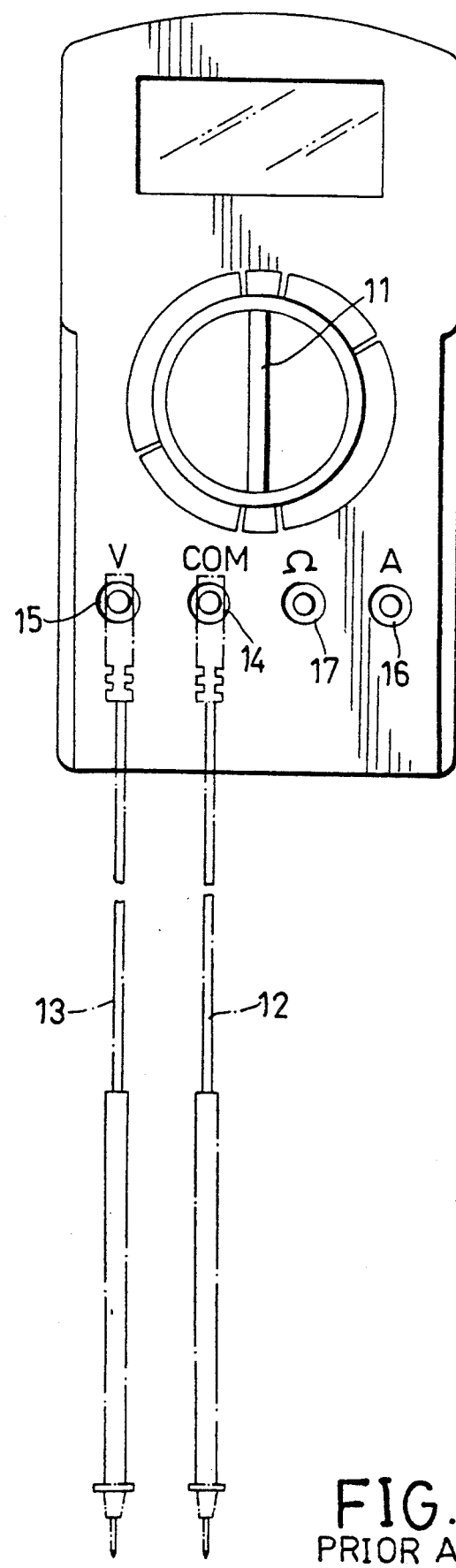
FIG. 1 is an illustration of a conventional volt-ohm-milliameter.
Figure 2:
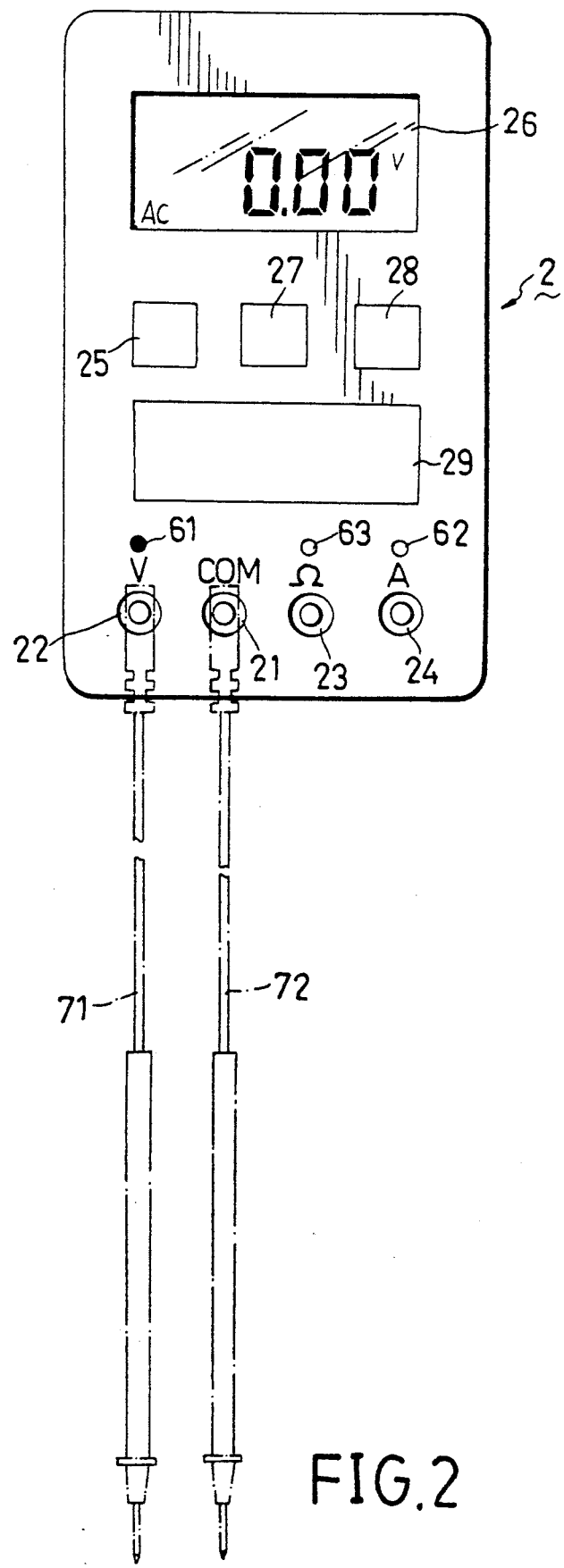
FIG. 2 illustrates a volt-ohm-milliameter which incorporates the preferred embodiment of a test lead socket indicating device according to the present invention when the volt-ohm-milliameter used to measure voltage.

Referring to FIG. 2, the preferred embodiment of a test lead socket indicating device according to the present invention is shown to be incorporated in a volt-ohm-milliameter (VOM) (2) having a common input socket (21), a voltage socket (22), a resistance socket (23) and a current socket (24) provided thereon. The VOM (2) is provided with a pressure-sensitive select input key (25) which is operated to set the VOM (2) in a voltage, current or resistance measuring mode. The VOM (2) further has a liquid crystal display (LCD) unit (26). The LCD unit (26) displays a numerical value (such as 0.00 as indicated in FIG. 2) and a measuring unit (such as AC and V, which indicates that the measured value is an AC voltage). The VOM (2) is further provided with a pressure-sensitive range select key (27) to vary the position of a decimal point on the LCD unit (26) and a pressure-sensitive data hold key (28) to preserve a numerical value on the LCD unit (26). The VOM (2) is also provided with a solar cell means (29) for supplying electric power thereto.

Figure 3:
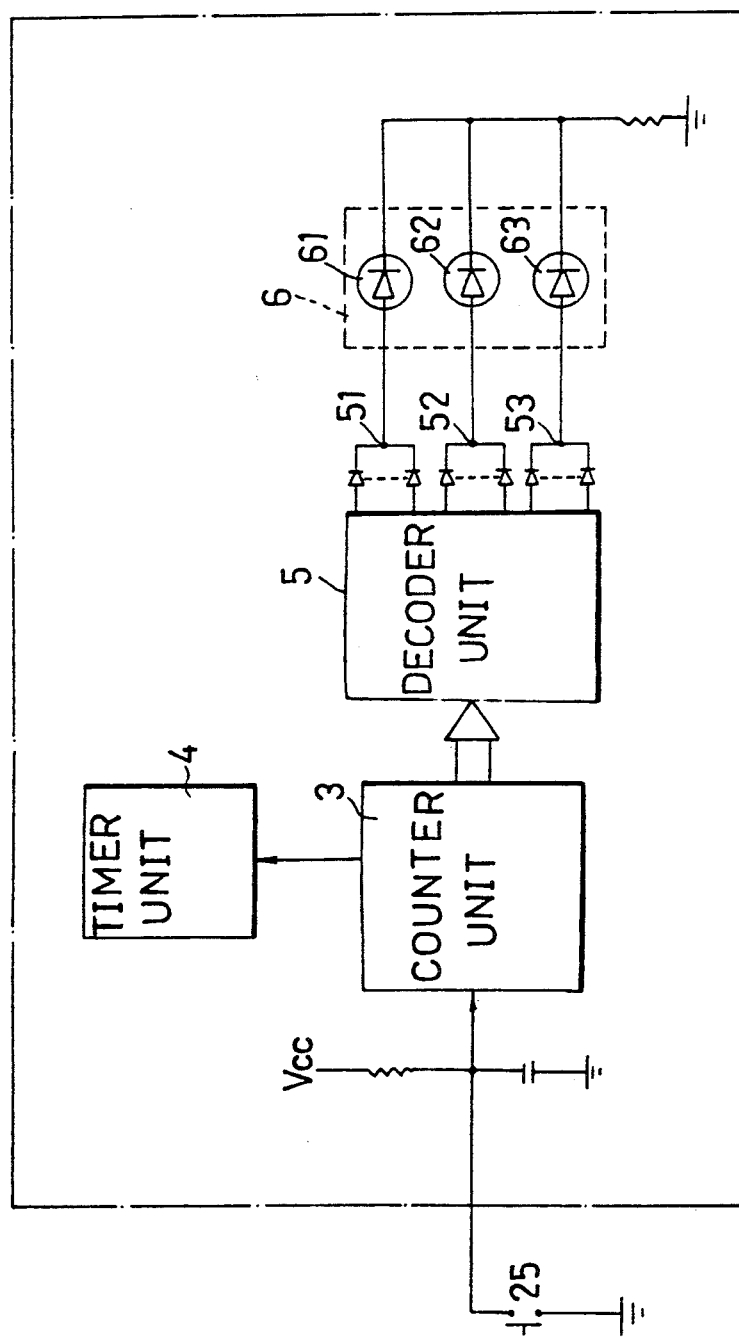
FIG. 3 is a schematic electrical circuit diagram of the preferred embodiment of a test lead socket device according to the present invention.

Referring to FIG. 3, the preferred embodiment of a test lead socket indicating device according to the present invention is shown to comprise a counter unit (3), a timer unit (4), a decoder unit (5) and an indicator unit (6).

The counter unit (3) has an input terminal connected to the select input key (25). The counter unit (3) has a digital signal output which is incremented each time the select input key (25) is pressed. The time unit (4) is reset by the counter unit (3) each time the digital signal output of the counter unit (3) changes. The timer unit (4) automatically cuts off the power supply to the VOM (2) after a predetermined period of time in which no change in the digital signal output of the counter unit (3) is detected.

The decoder unit (5) receives the digital signal output of the counter unit (3) and decodes the same so as to produce a voltage test signal, a current test signal or a resistance test signal. The decoder unit (5) has a voltage terminal (51), a current terminal (52) and a resistance terminal (53). The test signals are generated at a respective one of the terminals (51, 52, 53) of the decoder unit (5). The indicator unit (6) includes a voltage indicator lamp (61), a current indicator lamp (62) and a resistance indicator lamp (63). The indicator lamps (61, 62, 63) are connected to a respective one of the terminals (51, 52, 53) and are activated by the test signals present at the terminals (51, 52, 53). The indicator lamps (61, 62, 63) are mounted on the VOM (2) adjacent to a respective one of the sockets (22, 23, 24) (Refer to FIG. 2).

The operation of the preferred embodiment is as follows:

1. Referring to FIG. 2, when the select input key (25) is operated to set the VOM (2) in the voltage measuring function [the units AC and V are shown in the LCD unit (26) at this stage so as to indicate that the measured value is an AC voltage], the decoder unit (5) generates a voltage test signal at the voltage terminal (51), thereby causing the voltage indicator lamp (61) to glow [The voltage indicator lamp (61) is shaded to indicate that it is in a glowing condition]. One end of a first test lead (72) is inserted in the common input socket (21). One end of a second test lead (71) can be properly inserted in the correct socket (22, 23, 24) by simply observing which one of the sockets (22, 23, 24) has a glowing indicator lamp disposed adjacent thereto. When the VOM (2) is in the voltage measuring mode, the voltage indicator lamp (61) is in a glowing condition so as to indicate correctly that the test lead (71) should be connected to the voltage socket (22) [The VOM (2) is conventional in construction, and thus, a detailed discussion of the construction and operation thereof will not be provided herein].

Figure 4:
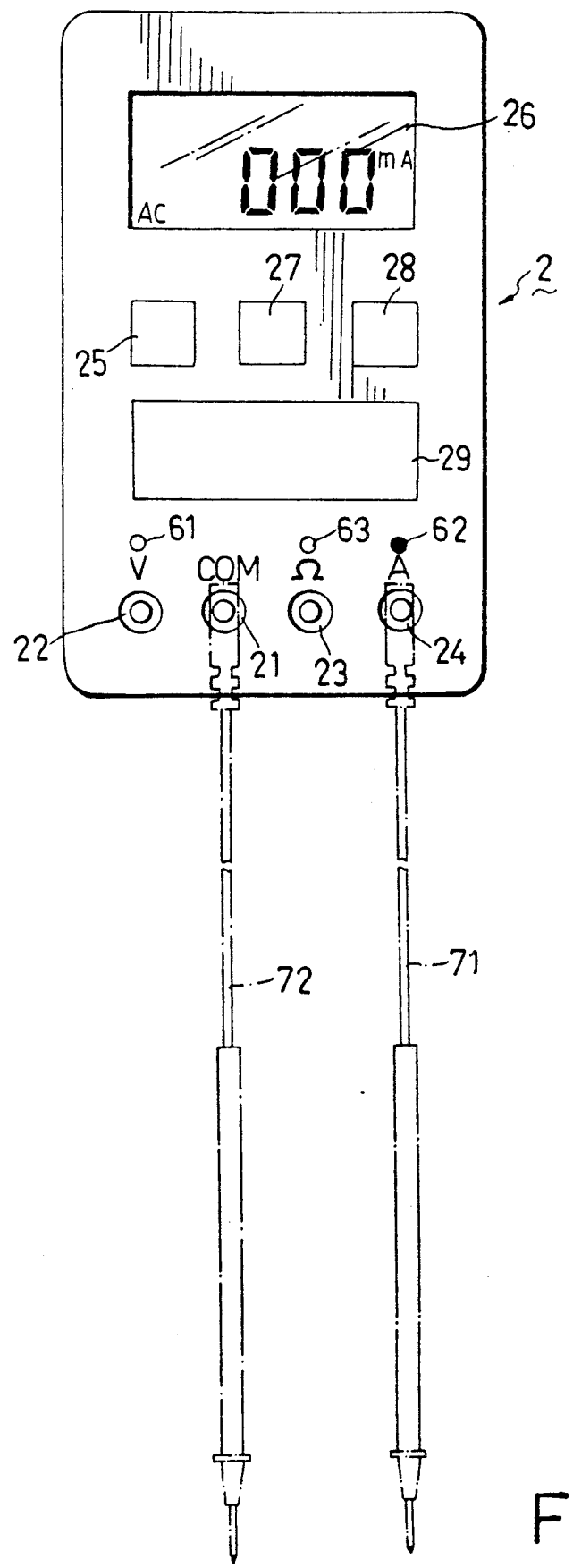
FIG. 4 illustrates a volt-ohm-milliameter which incorporates the preferred embodiment when the volt-ohm-milliameter is used to measure current.

2. Referring to FIG. 4, when the select input key (25) is operated to set the VOM (2) in the current measuring mode [the units AC and mA are shown in the LCD unit (26) at this stage so as to indicate that the measured value is an AC current], the decoder unit (5) generates a current test signal at the current terminal (52), thereby causing the current indicator lamp (62) to glow. The current indicator lamp (62) can thus correctly indicate that the test lead (71) should be connected to the current socket (23).

Figure 5:
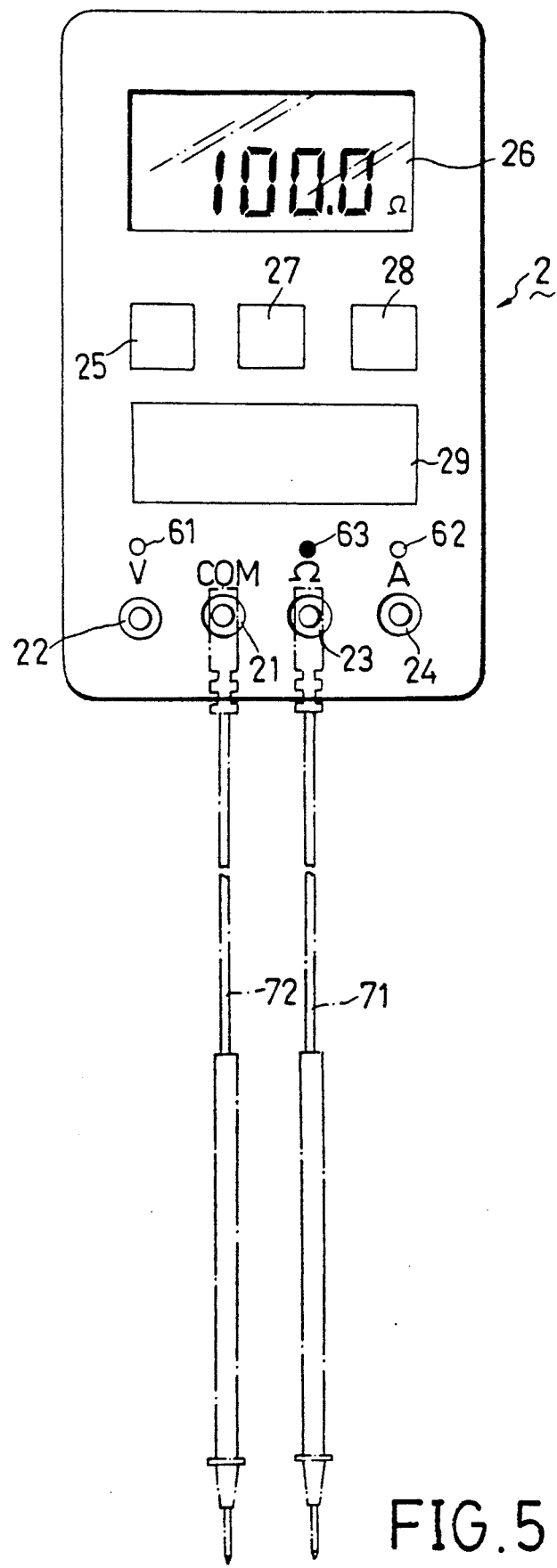
FIG. 5 illustrates a volt-ohm-milliameter which incorporates the preferred embodiment when the volt-ohm-milliameter is used to measure resistance.

3. Referring to FIG. 5, when the select input key (25) is operated to set the VOM (2) in the resistance measuring mode [the symbol Ω is shown in the LCD unit (26) at this stage so as to indicate that the measured value is a resistance value], the decoder unit (5) generates a resistance test signal at the resistance terminal (53), thereby causing the resistance indicator lamp (63) to glow. The resistance indicator lamp (63) can thus correctly indicate that the test lead (71) should be connected to the resistance socket (24).

It has thus been shown that when the VOM (2) is used to measure voltage, current or resistance values, one of the indicator lamps (61, 62, 62) glows so as to indicate to which one of the sockets (22, 23, 24) a test lead (71) should be connected to.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

I claim:

1. A test lead socket indicating device for a volt-ohm-milliameter having a common input socket, a voltage socket, a resistance socket, a current socket, and a select input means which is operable to set said volt-ohm-milliameter in a voltage, current or resistance measuring mode; said test lead socket indicating device comprising:

an indicator unit provided on said volt-ohm-milliameter which includes a voltage indicator lamp disposed adjacent to said voltage socket, a current indicator lamp disposed adjacent to said current socket and a resistance indicator lamp disposed adjacent to said resistance socket;

a counter unit having an input terminal connected to said select input means, said counter unit having a digital signal output which is incremented each time said select input means is operated; and a decoder unit for receiving said digital signal output from said counter unit, said decoder unit activating one of said voltage, current or resistance indicator lamps according to said digital signal output; said voltage, current or resistance indicator lamps indicating to which one of said voltage, current or resistance sockets a test lead should be connected.

2. The test lead socket indicating device as claimed in claim 1, further comprising a timer unit reset by said counter unit each time said digital signal output of said counter unit changes, said timer unit cutting off power supply to said volt-ohm-milliameter after a predetermined period of time in which no change in said digital signal output of said counter unit has occurred.

* * * * *